United States Patent
Yamaguchi et al.

(10) Patent No.: US 6,784,512 B2
(45) Date of Patent: Aug. 31, 2004

(54) PHOTODIODE AND METHOD OF PRODUCING SAME

(75) Inventors: Akira Yamaguchi, Osaka (JP); Yoshiki Kuhara, Osaka (JP); Takashi Sasaki, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 44 days.

(21) Appl. No.: 10/100,900

(22) Filed: Mar. 20, 2002

(65) Prior Publication Data

US 2002/0135035 A1 Sep. 26, 2002

(30) Foreign Application Priority Data

Mar. 23, 2001 (JP) .................................... 2001/084542

(51) Int. Cl.[7] ............................................. H01L 29/72
(52) U.S. Cl. ...................... 257/440; 257/432; 257/433; 257/434; 257/435; 257/632; 257/791
(58) Field of Search ................. 257/440, 432, 257/433, 434, 435, 632, 791

(56) References Cited

U.S. PATENT DOCUMENTS 5,266,501 A * 11/1993 Imai ............................ 438/60

FOREIGN PATENT DOCUMENTS

| JP | 11-83619 | 3/1999 |
| JP | 3046970 | 3/2000 |

OTHER PUBLICATIONS

Proceedings of the 2000 Society Conference of IEICE C–10–55 "Optical Cross–talk Reduction of LD/PD Module for ATM–PON System," Masahiro Mitsuda, et al. (In Japanese with Translation).

Proceedings of the 2000 Society Conference of IEICE B–10–59 "An ONU Transceiver Module using PLC for 622 Mb/s downstream ATM–PON system", R. Nomura, et al. (In Japanese with Translation).

* cited by examiner

Primary Examiner—Edward Wojciechowicz
(74) Attorney, Agent, or Firm—Smith, Gambrell & Russell, LLP

(57) ABSTRACT

A photodiode having a resin film painted upon an opening through which signal light goes in and a dielectric multi-layered film piled upon the resin film for reflecting noise light.

The elasticity of the resin film prevents the dielectric multilayered film from transforming or exfoliating by alleviating inner stress due to piling of tens to hundreds of different rigid dielectric layers.

48 Claims, 10 Drawing Sheets

Embodiment 1

Sensitivity distribution of the prior InGaAs-type PD

Embodiment 5

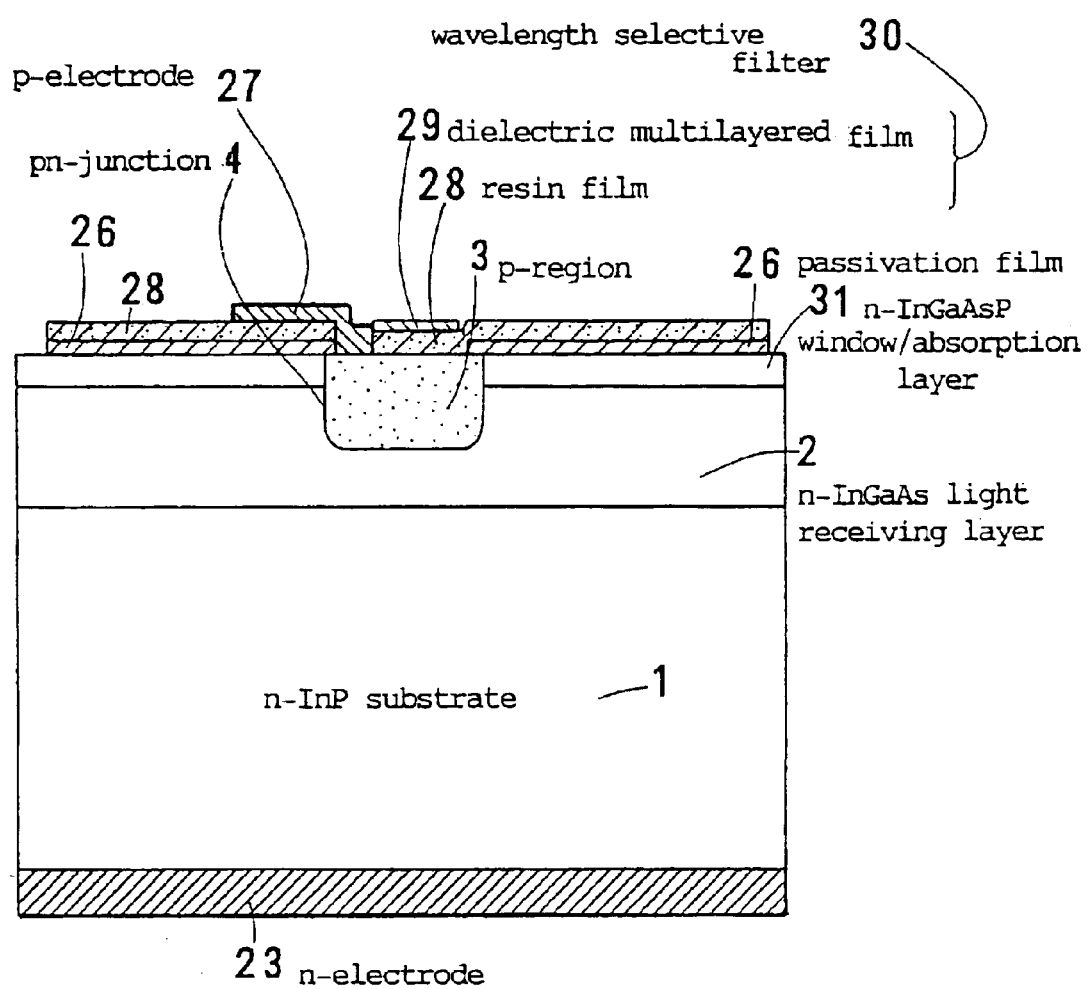

PHOTODIODE AND METHOD OF PRODUCING SAME

BACKGROUND OF THE INVENTION

1. Field of the Invention

This invention relates to a photodiode for a light receiving module of optical communications, in particular, a photodiode with wavelength selectivity suitable for wavelength division multiplex (WDM) optical communications. The WDM communications signifies an optical communications system making use of more than one wavelength of light as signal light. For example, a first wavelength $\lambda 1$ is allocated to transmission (upstream) light and a second wavelength $\lambda 2$ is assigned to receiving (downstream) light. In this case, the photodiode (PD) of a receiving module on a subscriber should preferably not feel $\lambda 1$ but sense only $\lambda 2$. Conventional photodiodes, however, have sensitivity both for $\lambda 1$ and $\lambda 2$.

This application claims the priority of Japanese Patent Application No.2001-84542 filed on Mar. 23, 2001 which is incorporated herein by reference.

2. Description of Related Art

FIG. 1 shows a cross-sectional view of a typical one of conventional photodiodes (PD). This is a bottom incidence type photodiode. The material of a light receiving layer depends upon the wavelengths of signal light. For example, in the case of the optical communication systems using a wavelength band ranging from 1.3 $\mu$m to 1.6 $\mu$m, an InGaAs layer 2 is epitaxially grown directly or indirectly on an n-InP substrate 1 as a light receiving layer. InGaAs is simplified expression of a ternary mixture crystal $In_{1-x}Ga_xAs$. Here, x is a mixture rate. The mixture rate is determined to be a definite value from the lattice matching condition between the InP substrate and the InGaAs light receiving layer. A p-type region 3 and a pn-junction 4 are produced by diffusing Zn, a typical p-type dopant, into a central part of the n-type light receiving layer 2.

The pn-junction has ends revealing on the top surface. The revealing ends are covered with an insulating film 6 (passivation film), e.g., of silicon nitride ($SiN_x$). A p-type electrode 5 is formed upon the p-type region 3. An annular n-type electrode 7 with a central opening is made upon the bottom of the n-InP substrate 1. An antireflection film 8 is laminated upon the opening of the InP substrate 1. A photodiode is reversely biased by applying a lower voltage to the p-type electrode 5 (anode) and a higher voltage to the n-type electrode 7 (cathode) in use. The reverse bias induces depletion layers on both sides of the pn-junction 4, a p-type depletion layer on the p-side and an n-type depletion layer on the n-side. The n-type depletion layer on the n-side is important. Signal light 9 goes via the antireflection film 8 into the bottom of the InP substrate 1, and attains to the n-type depletion layer in the light receiving layer. Light having energy larger than a band gap makes pairs of electrons and holes by inducing a band gap transition of electrons from a valence band up to a conduction band. An electric field formed by the reverse bias pulls holes upward over the pn-junction into the p-type region 3 and pushes electrons downward to the n-type region, which induces photocurrent. The photocurrent is taken out from the photodiode. The band gap of the light receiving layer determines what wavelengths of light can be detected by the photodiode.

FIG. 2 shows wavelength dependence of sensitivity of the photodiode having an InGaAs light receiving layer. The abscissa is a wavelength ($\mu$m). The ordinate is sensitivity (A/W). The InGaAs photodiode has a wide range (Q) of sensitivity from 1 $\mu$m(P) to 1.6 $\mu$m(R). The InGaAs photodiodes are endowed with high utility and prevalence by the wideness of the sensitivity range.

The wide sensitivity range incurs a problem on the photodiodes in the case of the multiwavelength optical communications which includes a plurality of wavelengths of light signals. Conventional InGaAs photodiodes have sensitivity for not only the object wavelength $\lambda 2$ but also the noise wavelength $\lambda 1$ to which the PD should not response.

For example, in the case of a single fiber bidirectional, optical communications system making use of a 1.3 $\mu$m wavelength ($\lambda 1$) and 1.55 $\mu$m wavelength ($\lambda 2$), 1.3 $\mu$m light emitted from a laser diode (LD) is noise to a 1.55 $\mu$m-detecting PD. The 1.3 $\mu$m light emitted from the laser diode tends to go into the photodiode, which induces noise in the 1.55 $\mu$m-detecting photodiode. The above is a problem appearing in a bidirectional transmission system in the full duplex transmission mode Otherwise, a rapidly developing dense wavelength division multiplexing (DWDM) system or coarse wavelength division multiplexing (CWDM) system contains a plurality of channels and uses a set of different wavelengths with a narrow spacing for one direction stream of signals for the channels and another set of different wavelengths with a narrow spacing for the other direction stream of signals for the channels. The DWDM and the CWDM require sophisticated laser diodes which can produce many different wavelenghs of light which are rich in monochromacity. The photodiodes having a wide range of sensitivity as shown in FIG. 2, are not favorable for the DWDM and the CWDM, because the PD would invite serious crosstalk among neighboring channels. On the contrary, the photodiodes having a narrow range of sensitivity with fine resolution ($\Delta\lambda$) of a nanometer to tens of nanometers are suitable for suppressing crosstalk among different channels with small differences of wavelength. An important problem is how to give photodiodes sharp wavelength selectivity for meeting the requirement of suppressing the crosstalk among the channels.

One way of assigning wavelength selectivity is an addition of a dielectric multilayered film to a wide sensitivity range photodiode. A wavelength selective photodiode is obtained by adding a dielectric multilayered film on the market to the opening of the bottom of the wide sensitivity range PD of FIG. 1.

① Masahiro Mitsuda, Tohru Nishikawa, Tomoaki Uno, Masato Ishino, "Optical Cross-talk Reduction of LD/PD Module for ATM-PON System", Proceedings of the 2000 Communications Society Conference of IEICE, B-10-55, p278, proposed an LD/PD module employing a double-cladding optical fiber, adding a 1.3 $\mu$m absorbing InGaAsP layer on the top of a photodiode, laying the photodiode epi-down on a glass substrate, painting an enclosure of the photodiode with a stray light absorbing resin for suppressing crosstalk. The double cladding prevents once fiber entering LD light ($\lambda 1$) from leaking out of the fiber. The InGaAsP absorption layer fitted to the top of the photodiode absorbs 1.3 $\mu$m light which is noise for the photodiode. The painted resin eliminates the 1.3 $\mu$m noise light from the photodiode. ① employs three different means for eliminating noise light from the photodiode.

② R. Momura, H. Yanagisawa, A. Goto, Y. Fukutomi, N. Kitamura, M. Kunitsugu, K. Kaede," An ONU Transceiver Module using PLC for 622 Mb/s downstream ATM-PON system", Proceedings of the 2000 Communications Society Conference of IEICE, B-10-59, p282, proposed a transceiver (LD/PD) module which protects a photodiode from invasion of LD light by a WDM (wavelength division multiplexing) filter. The WDM filter is a dielectric multilayered film made on a glass substrate having wavelength selectivity.

The dielectric multilayered film is made by piling repeatedly in turn at least two kinds of dielectric layers with different refractive indexes and different thicknesses on the glass substrate. The on-glass dielectric film has wavelength selective reflection and wavelength selective transparency. Reflection wavelength and transparent wavelength are determined by the choice of refractive indexes and thicknesses of dielectric layers. Arbitrary wavelengths can be assigned to the reflection wavelength and the transparent wavelength by selecting refractive indexes and thicknesses of the component dielectric layers. The reflection rate and the transparency are enhanced by increasing the number of repetitions of piling of a pair of dielectric layers. Dielectric multilayered filters on the market are all glass-based filters produced on independent glass substrates. On-glass dielectric multilayered films on sale have drawbacks of a size as large as and a price as high as a photodiode module itself at present. It takes much time and higher cost to install the external, independent on-glass dielectric multilayered film in front of the photodiode. Coupling of the photodiode module to the on-glass dielectric multilayered film would raise cost and volume in a great measure.

Another prior art which should be described here is an absorption layer built-in a photodiode which invented before by the same inventors as the present invention. The absorption layer has no direct relation to a novelty of the present invention. Since some embodiments will make use of the known absorption layer, references of the absorption layer are here cited.

③ Japanese Patent Application No.9-256107 (256107/'97), "Photodiode and Photodiode Module", (Japanese Patent Laying-Open No.11-83619) proposed a photodiode having an InGaAsP absorption layer made on either a top surface or a bottom surface of a substrate for absorbing noise $\lambda 1$ light.

④ Japanese Patent Application No.11-260016(260016/'99), "Photodiode", (Japanese Patent No.3046970) proposed a photodiode having two InGaAsP absorption layer made on both top and bottom surfaces of a substrate for absorbing noise $\lambda 1$ light.

The above two references suggested photodiodes including built-in absorption layers for noise $\lambda 1$ light. The inventors who are the same inventors as the present invention were aware that a semiconductor with a band gap wavelength $\lambda g$ absorbs the light of shorter wavelength $\lambda$ than $\lambda g$ ($\lambda < \lambda g$) but does not absorb the light of longer wavelength $\lambda$ than $\lambda g$ ($\lambda > \lambda g$). The inventors hit upon an addition of a layer of the bandgap wavelength $\lambda g$ which satisfies inequality $\lambda 1 < \lambda g < \lambda 2$ to a photodiode for annihilating noise $\lambda 1$ light. The absorption layer carried in the photodiode is suitable for a single fiber bidirectional optical communications. In the case of an ONU (subscriber site) of communication systems using $\lambda 1 = 1.3$ $\mu$m (upstream) and $\lambda 2 = 1.55$ $\mu$m (downstream), an absorption layer of $\lambda g = 1.35$ $\mu$m to 1.5 $\mu$m, in particular $\lambda g = 1.4$ $\mu$m is advantageous. A quaternary mixture crystal $In_xGa_{1-x}As_yP_{1-y}$ corresponds to a band gap wavelength of $\lambda g = 1.35$ $\mu$m to 1.5 $\mu$m.

Prevalence of optical communications overall in the world requires size reduction and cost reduction of PD, LD or LD/PD modules. A photodiode itself should be miniaturized further.

One purpose of the present invention is to provide a noise-resistant photodiode which has an inherent function of suppressing cross talk by repulsing noise light. Another purpose of the present invention is to provide a photodiode having a built-in wavelength selective filter on an opening through which signal light goes in. Another purpose of the present invention is to provide a low-cost, small-sized, noise-resistant photodiode.

SUMMARY OF THE INVENTION

The present invention proposes a photodiode having a built-in dielectric multilayered film formed on a resin film deposited on a surface through which signal light goes in for repulsing noise $\lambda 1$ light. The built-in dielectric multilayered film and the intermediate resin characterize the present invention. Complicated dielectric multilayered films, in general, cause strong inner stress. Strong inner stress prevents a photodiode from wearing the complicated dielectric multilayered film directly. The intermediate resin has enough elasticity for reducing inner stress induced by the built-in dielectric multilayered film. The problem of the inner stress is described.

The conventional photodiode (PD) of FIG. 1 has the antireflection film 8 deposited directly on the aperture of the bottom of the substrate 1 for alleviating reflection of signal light. The antireflection film can be produced by evaporation or sputtering. The antireflection film 8 is a kind of dielectric multilayered films. The purpose of the antireflection film is not to reflect the light (signal light; $\lambda 2$) to be sensed so much. A simple condition of suppressing the reflection of the signal light is imposed upon the design of the antireflection film. Since the condition is simple, a small number of the dielectric layers is enough to form the antireflection film. Piling of different materials induces inner stress in the film and the substrate. Inner stress increases in proportion to the number of the dielectric layers. The small number of dielectric layers protects the antireflection film from inner stress.

The antireflection film is made by piling a few transparent dielectric thin layers of $MgF_2$, $SiO_2$, $Al_2O_3$, $TiO_2$, $Zr_2O_3$, SiON, $Ta_2O_5$ or $Nb_2O_5$ less than ten layers in turn on an InP substrate or an InGaAs layer by sputtering or evaporation. Even a single layer can play the role of the antireflection film. Two to six layers usually construct the antireflection film. The simple condition of reducing reflection of only a wavelength saves the number of dielectric layers constructing the antireflection film. Weak inner stress allows depositing the antireflection film directly on the substrate.

A wavelength selective filter which separates two wavelengths with a narrow difference $\Delta \lambda$ should satisfy far more difficult conditions than the antireflection film. The smaller the wavelength difference $\Delta \lambda$ decreases, the more the number of the necessary layers increases. A dielectric multilayered film for wavelength selection requires a pile of tens to hundreds of dielectric layers. Such a set of many different dielectric thin layer is usually made on an independent rigid glass substrate which is high resistance against inner stress. Independent wavelength selective dielectric multilayered filters made on glass substrates are on the market as a passive optical part. It is unfavorable to deposit such a thick pile of tens to hundreds of dielectric layers on a PD substrate directly. Differences of thermal expansion among the PD semiconductor and the different dielectric layers induce distortion, exfoliation or other degradation of the dielectric multilayered filter through an increase of inner stress. Thus, direct deposition to the PD chip of tens to hundreds of dielectric thin layers is impossible.

The present invention solves the problem of distortion, exfoliation or other degradation by depositing an elastic transparent resin film on a surface of a photodiode and forming a dielectric multilayered film on the elastic transparent resin. The elastic transparent resin intermediates between the photodiode semiconductor and the dielectric layers. The elasticity of the resin film absorbs differences of the thermal expansion coefficients and alleviates inner stress occurring between the photodiode chip and the dielectric layers. The elastic resin protects the upper dielectric multilayered film from transforming or peeling off from the PD semiconductor. The dielectric multilayered film is nearly free from inner stress owing to the intervening resin film. The resin film can absorb non-uniformity of the semiconductor surface. The gist of the present invention is a three-storied, stress-alleviating structure of semiconductor/resin/dielectrics. Available variations of resins, dielectric films and types of photodiodes are preliminarily described for clarifying the scope of the present invention.

[Resins]

A resin film is produced on a semiconductor (substrate or film) by spin-coating a semiconductor (substrate or film) with a transparent resin fluid and hardening the resin into a thin resin film by heating or UV-irradiation. Suitable resins are polyimide, fluoric polyimide, benzocyclobutene(BCB), deuteride silicone resins, or siloxane polymer. The resins have sufficient elasticity after hardening. Thick, hard dielectric films are deposited on the resin film by evaporation or sputtering. The elasticity of the resin film absorbs differences of thermal expansion between the semiconductor and the thick dielectric layers.

[Dielectric Multilayers]

A wavelength selective dielectric film is built by repeatedly piling in turn at least two kinds of transparent dielectric thin layers of, for example, $MgF_2$, $SiO_2$, $Al_2O_3$, $TiO_2$, $Zr_2O_3$, SiON, $Ta_2O_5$ or $Nb_2O_5$ which is transparent to signal light of $\lambda 2$. These materials have different refractive indices. A pile of thin layers of different refractive indexes and different thicknesses generates desired wavelength selective reflection. Dielectric multilayers piled upon a glass substrate have been well known as a wavelength selective filter. A semiconductor device carrying the rigid pile of the dielectric multilayers is novel. These oxides have all strong rigidity itself. A direct pile of the oxides on a semiconductor would cause big inner stress, large distortion, transformation, exfoliation or breakdown of the PD itself. The intermediate resin enables the present invention to build the dielectric multilayered film in the photodiode for the first time.

[Fabrication of Films]

The resin film is made by spin-coating an object surface of a semiconductor (bottom substrate or top light receiving layer) with a material resin fluid and thermohardening or UV-hardening the resin film. Spin-coating is a convenient method which adjusts a film thickness by varying the rotation speed. The way of hardening (thermohardening or UV-hardening) depends upon the inherent property of the object resin. Sufficient elasticity remains in the resin after hardening.

The dielectric multilayered film is produced by evaporating, sputtering or chemical-vapor-depositing (CVD) at least two oxides above-described of definite thicknesses repeatedly in turn on the resin film. The wavelength selective filter consists of the resin film and the dielectric multilayered film. Photolithography can reform a once fabricated wavelength selective filter into an arbitrary shape.

The hardening temperature of the thermohardening resins is lower than the temperature of heating steps included in the wafer process. Formation of the (thermohardening) resin film causes no degradation of the devices made in the preceding wafer process. The fact allows the present invention to make the wavelength selective filters at a stroke for all chip parts on the wafer on the whole at a final stage of the wafer process. This is an important advantage of the present invention. After the fabrication of the wavelength selective filters, the wafer is divided into individual photodiode chips by scribing crosswise and lengthwise along cleavage lines. The present invention is preferable for mass production, which cuts cost down.

Fortunately, the present invention scarcely changes the shape and the size of the photodiode, because no independent part is assigned to the photodiode. Mounting the photodiode chip on a silicon bench of the PD module is similar to a conventional one.

[Fabrication of Lens]

The intervening resin favors the present invention with another important advantage. Amorphous resin fluid allows a photodiode to make a converging lens on the bottom of a substrate. A dielectric multilayered film requires a definite incidence angle (right angle incidence or so) for displaying the predetermined wavelength selection performance. Discrepancy of the incidence angle incurs extra penetration of noise light. Thus, a base for the dielectric multilayered film should be a flat surface. A curved surface of the lens is unfavorable for direct deposition of the dielectric multilayered film. The intermediate resin film enables the present invention to make a built-in lens on a substrate by preparing a flat surface upon the curved surface. Although the substrate is fabricated into a curved (lensed) surface, fluidity of the resin material liquid buries the curvatures so long as the thickness of the resin is larger than the height of the built-in lens. Spin-coating allows a resin material fluid to cover the lensed surface into a flat plane. The flat surface of the resin film serves a preferable flat base for producing a dielectric multilayered film thereon.

The built-in lens has a function of converging incidence light effectively at a sensing region (depletion layers on the pn-junction). Indium phosphide (InP) has a high refractive index of n=3.5. Even a low height lens of InP has a short focal length and a strong converging function. The use of a built-in lens is less expensive than mounting of a individual, separated lens. The lens converges light to a small spot at the pn-junction, which enhances the efficiency of the O/E conversion. Further, the lens enables the photodiode to narrow the sensing region (pn-junction, p-type region). A conventional sensing region has a diameter of 100 $\mu$m to 150 $\mu$m. A sensing region can be reduce under 100 $\mu$m, e.g., 80 $\mu$m to 50 $\mu$m in the lens-formed photodiode of the present invention. The most favorable case allows a sensing region of a diameter of 30 $\mu$m. The narrow sensing region favors a photodiode with high speed response (e.g., more than 2.5 Gbps) by lowering the electrostatic capacitance. In the lensed photodiode, the resin film plays the role of absorbing the curvature forming a lens on the semiconductor substrate and preparing a flat base for the dielectric layers in addition to alleviation of inner stress due to discrepancy of thermal expansion between the dielectric layers and the semiconductor.

[Materials of Photodiodes]

This invention can be applied to a photodiode having an InP substrate, another photodiode having a Si substrate and a further photodiode having a GaAs substrate. An Si-PD and a GaAs-PD sense visible light. A PD on InP senses near infrared light. In the case of a photodiode based upon an InP substrate, the substrate is an n-type InP, a p-type InP or a semi-insulating (SI—) InP.

The photodiodes based on the InP substrates have a light receiving layer of a ternary mixture crystal of $In_xGa_{1-x}As$ or a quaternary mixture crystal of $In_xGa_{1-x}As_{1-y}P_y$. An InGaAs photodiode has a definite sensitivity range from 1 μm to 1.6 μm as shown in FIG. 2. InGaAsP photodiodes can be endowed with various sensitivity ranges which are changed by controlling the mixture rates of x and y in $In_xGa_{1-x}As_{1-y}P_y$.

Basic component layers of a photodiode are a substrate and a light receiving layer. Optionally, a window/capping layer can be added on the light receiving layer. The window/capping layer has functions of suppressing dark current, reducing recombination of electrons and holes at the surface of the light receiving layer and raises sensitivity. The window layer and capping layer are equivalent layers. But the names change in accordance with the structure of a photodiode. In the case of a top incidence type, it is called a window layer. In the case of a bottom incidence type, it is called a capping layer.

Furthermore, a buffer layer can be optically inserted between the substrate and the light receiving layer. A full-component example has an (n-, p-, or SI—) InP substrate, an InP buffer layer, an InGaAs or InGaAsP light receiving layer and an InP window/capping layer.

[Directions of Light]

A surface of a photodiode having the sensing region (pn-junction) is defined as a "top" surface. The other surface of the photodiode is defined as a "bottom" surface. Photodiodes are classified by the direction of light into a "bottom incidence", a "top incidence" and a "front end incidence" types.

A bottom incidence type means a photodiode into which light goes via the substrate bottom. In the bottom incidence type, one annular electrode is formed on the bottom and the other electrode is formed overall on the top sensing region above the pn-junction. The resin film and the dielectric film are produced on an epitaxial wafer in the wafer process before separating into chips in this case.

A top incidence type means a photodiode into which light goes via the top. In the top incidence type, one electrode is overall formed on the bottom and the other electrode is formed in an annulus on the top sensing region above the pn-junction. The resin film and the dielectric film are produced on an epitaxial wafer in the wafer process before separating into chips also in this case.

A front end incidence type means a photodiode into which light goes via the front end in parallel with the top and the bottom surfaces. In the front end incidence type, one electrode is overall formed on the bottom and the other electrode is also overall formed on the top sensing region above the pn-junction. The resin film and the dielectric film are produced on a front end of an isolated photodiode chip after separation.

This invention can be applied all to the top, bottom and front end incidence types of photodiodes. The bottom incidence type and the top incidence type are, in particular, preferable for the present invention.

[Addition of Epitaxial Absorption Layers]

The present invention aims at proposing a photodiode which is sensitive for signal light λ2 to be sensed but insensitive to the other light (noise) λ1 to be rejected.

Besides the wavelength selective filter, an addition of a semiconductor layer which absorbs noise λ1 light is effective for annihilating crosstalk. The λ1 absorption layer is not novel, since the same inventors as the present invention had invented as described before. λg denotes a band gap wavelength of a semiconductor. A semiconductor with a band gap wavelength λg which satisfies λ1<λg<λ2 absorbs λ1 but allows λ2 to pass through. An InGaAsP (λg) layer can be a λ1 absorption layer for a photodiode with an InGaAs light receiving layer.

In the case of photodiode with an InGaAsP light receiving layer which absorbs λ2, another InGaAsP (λg) layer can be assigned to be a λ1 absorption layer. Mixture ratios are different for the InGaAsP of the light receiving layer and the InGaAsP of the absorption layer. The light receiving layer InGaAsP has a band gap wavelength longer than λ2. The absorption layer InGaAsP has a band gap wavelength shorter than λ2 but longer than λ1. Two parameters allow quaternary mixture crystal InGaAsP to make a λ1 absorption layer and a light receiving layer satisfying lattice fitting condition.

Such an absorption layer can be assigned to either a top surface or a bottom surface of a substrate for absorbing noise light of λ1. It is more effective to add two absorption layers on both surfaces of the substrate. The improvement excludes doubly the noise λ1 light by the λ1 absorption layer and the wavelength selective filter. The modes of exclusion are different for the two devices. The dielectric multilayer excludes noise light by reflecting. Noise reflection rate increases in proportion to the number of dielectric layers. Hundreds of layers are required for reflecting perfectly noise light. However, reflected noise light survives and returns to the photodiode again and again by being reflected by parts or walls of a package. Besides, the reflection rate has strong dependence upon the incidence angle. The dielectric multilayer cannot prevent slanting stray noise from invading into the photodiode. Exclusion by the dielectric multilayer is imperfect in some cases.

On the contrary, an epitaxially-grown λ1 absorption layer absorbs noise light. Noise light does not survive. Slanting stray noise light is also absorbed by the λ1 absorption layer. Absorption has no dependence upon the incidence angle.

When the strength of noise light is weak, the dielectric multilayered film is sufficient for excluding noise. When noise light is strong, an addition of the absorption layer is effective to eliminate noise completely.

Advantages of the present invention are described.

(1) The elastic intervening resin film protects the dielectric multilayered film from transforming and exfoliating by alleviating inner stress and distortion.
(2) Current photolithography enables the present invention to produce the wavelength selective filter easily.
(3) Plenty of wavelength selective filters can be made on a wide wafer at a stroke in the wafer process before separation into chips. Mass production lowers cost of fabricating the photodiodes.
(4) The size and the shape of photodiodes are scarcely changed by the addition of the resin film and the dielectric layers. The manner and condition for mounting the photodiode are similar to that of the conventional photodiodes.
(5) If a converging lens is made on the semiconductor surface, a resin film conveniently gives a flat plane as a base on which the dielectric films are deposited.

BRIEF DESCRIPTION OF THE DRAWINGS

FIG. 7(1) shows the wafer at a step of making lenses on the bottom of the SI-substrate. FIG. 7(2) shows a part of the wafer upside down at a step of coating the lensed bottom of an SI-substrate with a transparent resin. FIG. 7(3) shows a part of the wafer upside down at a step of making a pattern for a multilayer filter and evaporation-coating of the multilayer on the bottom of the lensed SI-InP substrate. FIG. 7(4) shows a photodiode chip scribed into individual chips from the wafer in a normal posture.

FIG. 10 is a cross-sectional view of Embodiment 7 of the present invention applied to a high-speed, top incidence type photodiode having an n-InP substrate, a narrow top aperture for light incidence and an InGaAsP window and absorption layer.

DETAILED DESCRIPTION OF THE PREFERRED EMBODIMENTS

Figure 1:
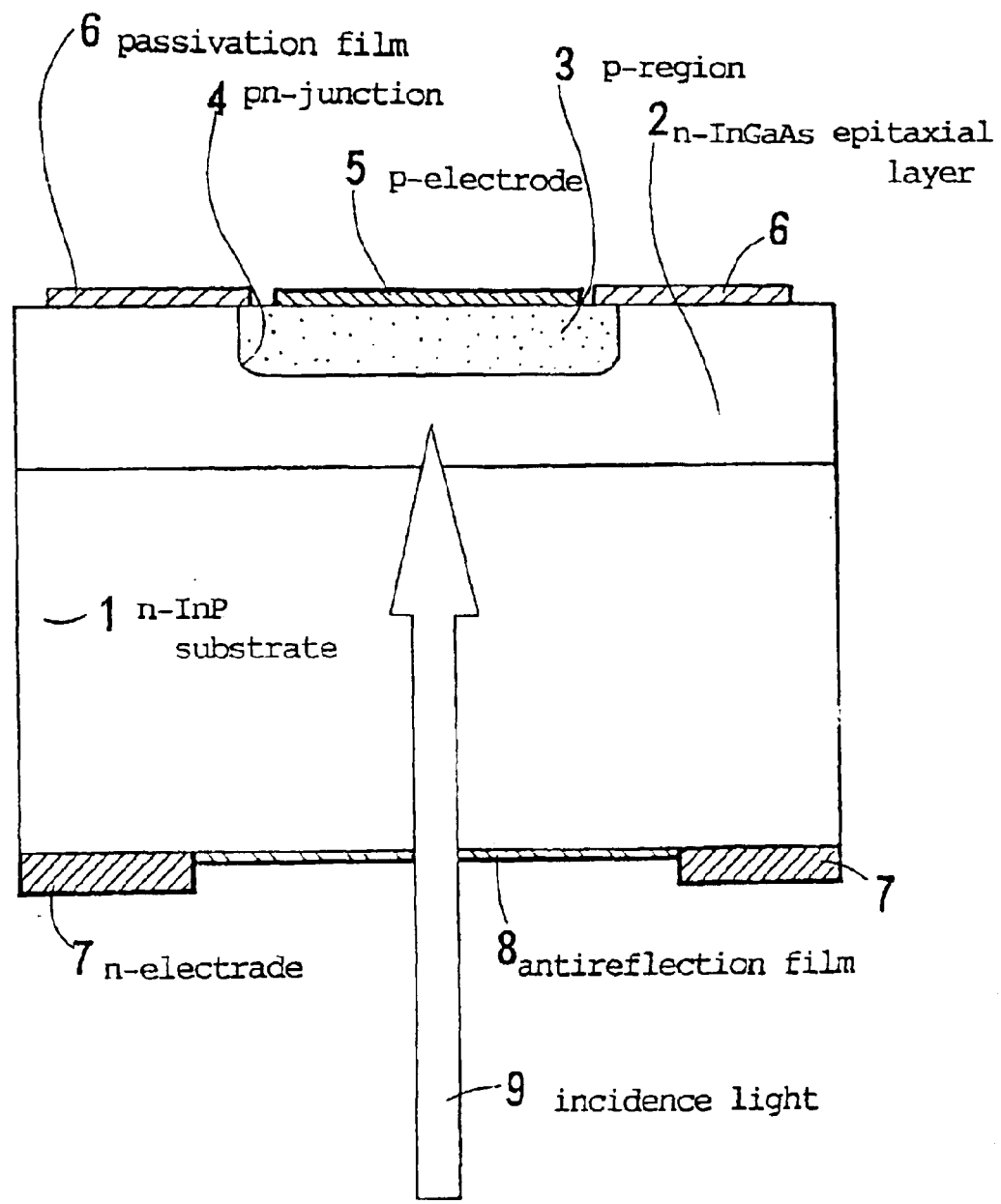
FIG. 1 is a cross-sectional view of prior art of bottom incidence type photodiodes having an InGaAs light receiving layer.
Figure 2:
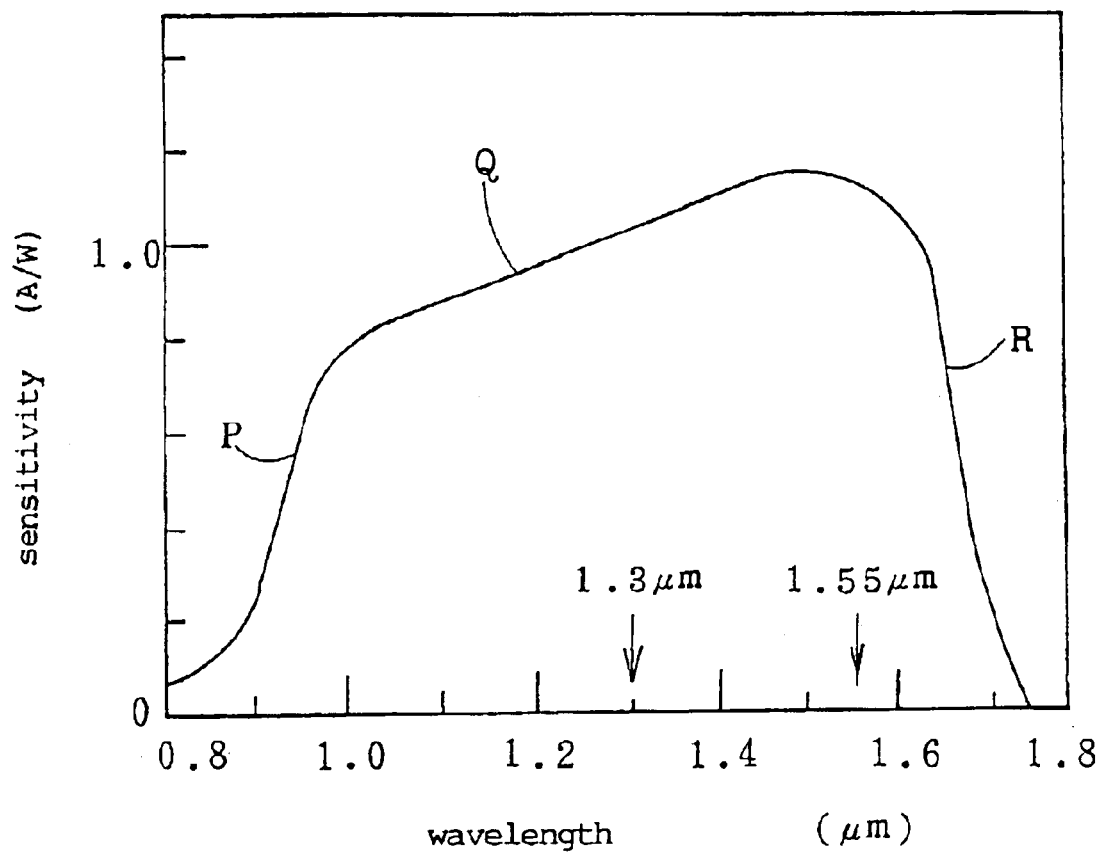
FIG. 2 is a graph showing wavelength dependence of sensitivity of the conventional InGaAs photodiode of FIG. 1.
Figure 3:
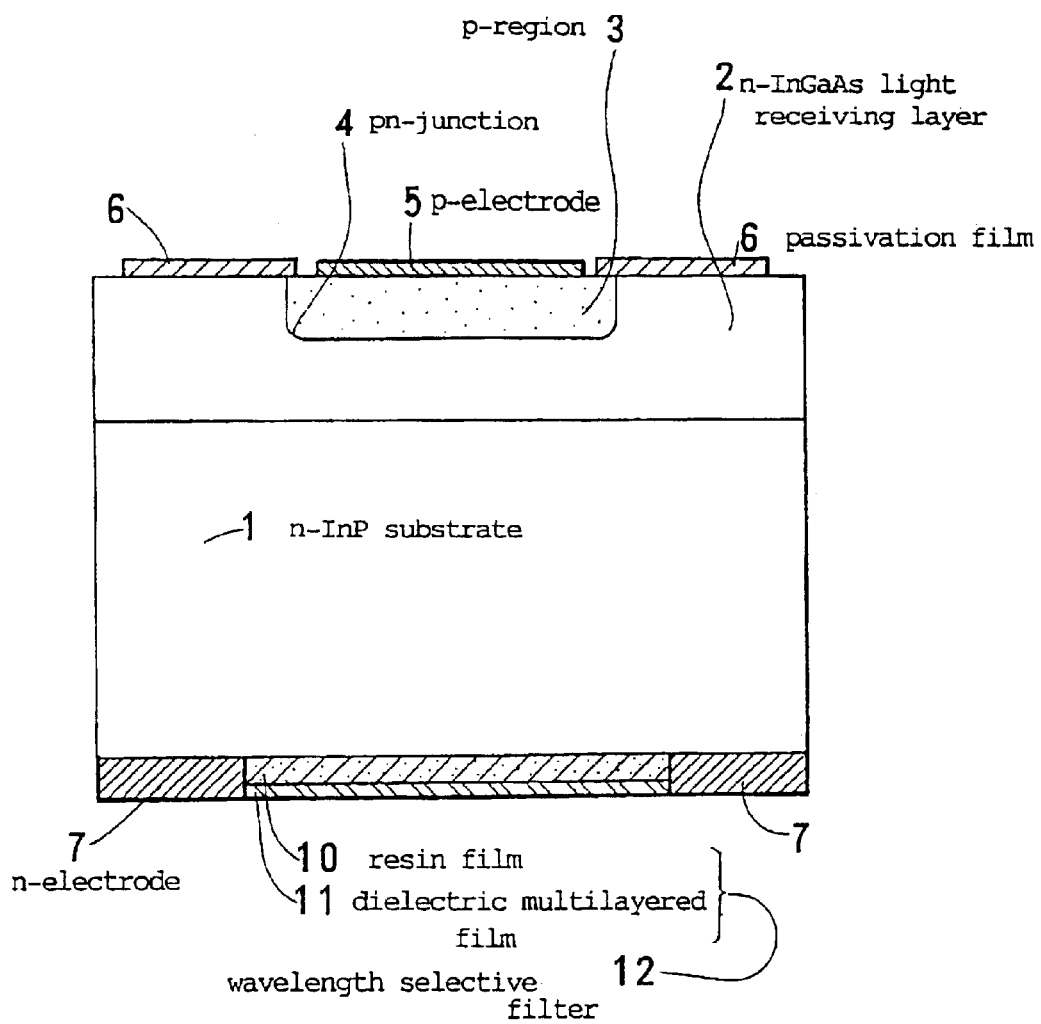
FIG. 3 is a cross-sectional view of Embodiment 1 of the present invention applied to a bottom incidence type photodiode having an n-InP substrate.

Embodiment 1 (Bottom Incidence Type, n-type Substrate; FIG. 3)

FIG. 3 shows Embodiment 1 of the present invention applied to a bottom incidence type photodiode. This is a basic structure of the present invention.

A starting wafer is an n-type InP wafer as a substrate. An InGaAs light receiving layer 2 is epitaxially grown on the n-InP substrate 1. A p-type region 3 is formed at a central part of the InGaAs light receiving layer 2 by thermal diffusion of an p-dopant (e.g., zinc (Zn)) via a mask. A boundary between the n-InGaAs light receiving layer 2 and the p-type region 3 is a pn-junction 4. The pn-junction makes depletion layers of lacking carriers on both sides. Entering light makes pairs of electrons and holes in the depletion layers by exciting electrons from the valence band to the conduction band of the InGaAs light receiving layer. Thickness of the depletion layers is reversely proportional to a root of the carrier density. An n-depletion layer on the n-side beneath the pn-junction is wide and significant, because the n-InGaAs layer has low carrier density. A p-depletion layer on the p-side above the pn-junction 4 is narrow and insignificant, because the p-type region has high carrier density.

An allover metal p-type electrode 5 is formed upon the p-type region 3. Ends of the pn-junction 4 appear on the top surface. The ends of the pn-junction 4 are covered with a passivation film 6. An annular n-type electrode 7 having an opening is formed upon the bottom of the n-InP substrate 1. The bottom aperture is covered with a resin film 10 (e.g., polyimide) and a dielectric multilayered film 11. A set of the resin film 10 and the dielectric multilayered film 11 is called a "wavelength selective filter" 12. The present invention covers an opening for light entrance with the wavelength selective filter. In the case of the bottom incidence type, the wavelength selective filter shields the bottom aperture from noise. In the case of a top incidence type, the wavelength selective filter shields the top aperture from noise. The present invention is characterized by the wavelength selective filter protecting the light entrance opening. Light including $\lambda 1$ and $\lambda 2$ comes into the photodiode via the bottom opening. Noise light $\lambda 1$ is absorbed by the built-in dielectric multilayered film 11. Only signal light $\lambda 2$ attains to the depletion layer just beneath the pn-junction 4.

Fabrication of the photodiode of Embodiment 1 is described. A starting material is a sulfur-doped n-InP substrate wafer which is transparent to a longer wavelength band in the optical communications. An n-InGaAs light receiving layer 2 is epitaxially grown upon the n-InP substrate wafer. This is an epitaxial wafer. A passivation film, e.g., of silicon nitride (SiN) is formed on the InGaAs layer and selectively etched into a mask having central holes for every chip part. Thermal diffusion of zinc (Zn) via the passivation mask produces a p-type region 3 and a pn-junction 4 at a center of each PD chip part predetermined on the wafer. Ends of the pn-junction 4 are naturally protected by the silicon nitride (SiN) films as the passivation film.

An allover p-type electrode 5 is formed on the p-type region 3 of every chip part. An annular n-type electrode 7 having an opening is formed on the bottom of every chip part. A flat polyimide resin film 10 is formed on the opening within the annular n-type electrode 7 of every chip part by spin coating. A dielectric multilayered film 11 is formed on the polyimide resin film 10 by evaporation or sputtering. The built-in resin film 10 and the dielectric multilayered film 11 constitute a wavelength selective filter 12.

The wavelength selective filter 12 should exclude noise light and allow signal light to pass through without loss. In the case of a photodiode (PD) which shall expel 1.3 $\mu$m light as noise and shall receive 1.55 $\mu$m light as signals (for example, $\lambda 1=1.3\,\mu m$, $\lambda 2=1.55\,\mu m$), the wavelength selective filter 12 should be designed to reflect the light of wavelengths shorter than a cut-off wavelength of, e.g., 1.42 $\mu$m and to allow the light of wavelengths longer than the cut-off wavelength to pass through. Such a dielectric multilayer having a cut-off wavelength can be easily designed and fabricated.

Extra parts of the the wavelength selective filter covering the n-type electrodes are eliminated till the n-type electrode appears to the bottom by etching based upon photolithography. The wafer-processed InP wafer is cut into individual PD chips by dicing or cleaving lengthwise and crosswise the wafer along cleavage lines.

Figure 4:
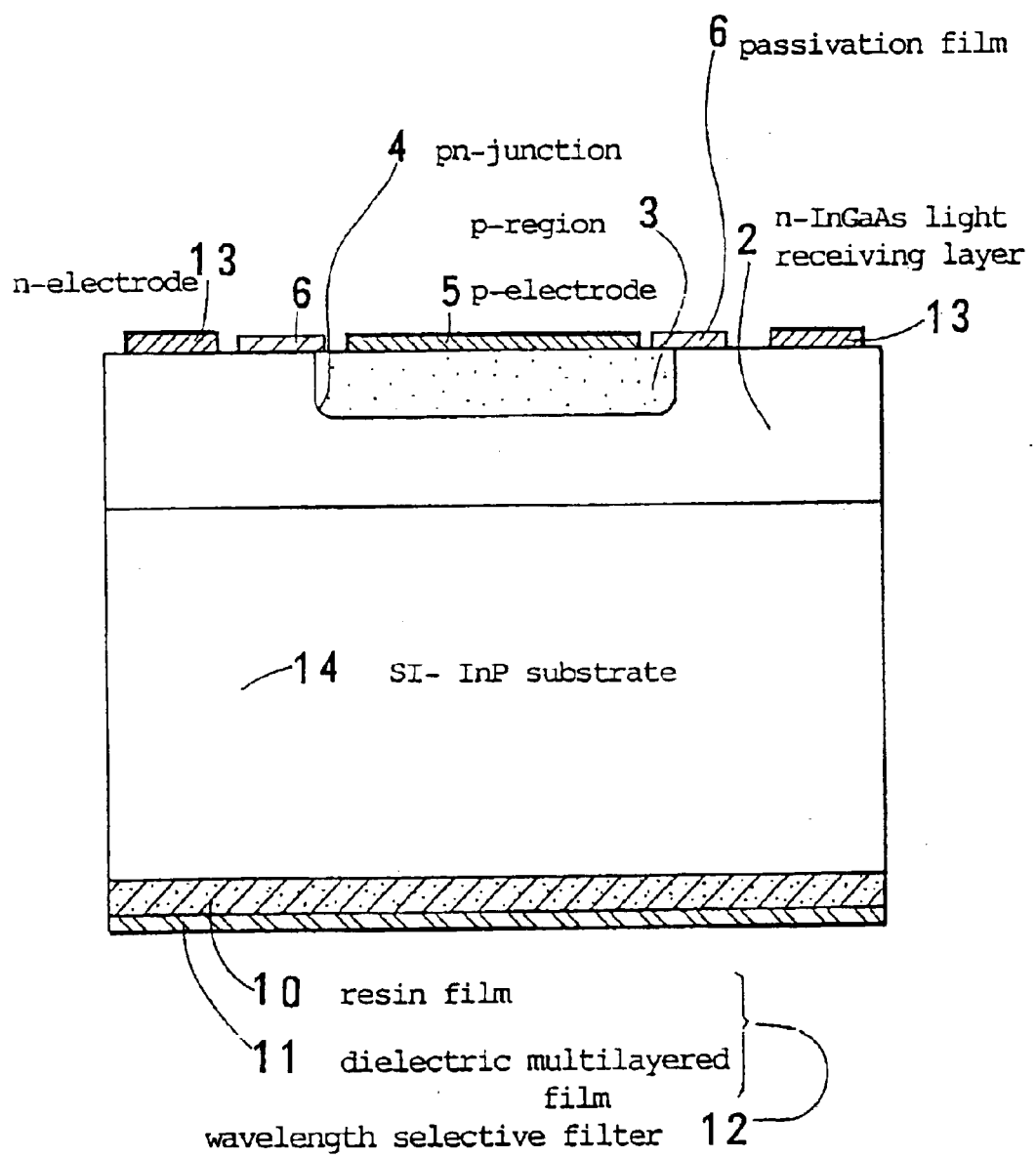
FIG. 4 is a cross-sectional view of Embodiment 2 of the present invention applied to a bottom incidence type photodiode having an SI (semi-insulating)-InP substrate.

Embodiment 2 (Bottom Incidence Type, SI-type Substrate; FIG. 4)

FIG. 4 shows Embodiment 2 of the present invention applied to a bottom incidence type photodiode having a semi-insulating (SI-) InP substrate. The semi-insulating (SI-) InP substrate which is made by doping with iron, cobalt or nickel has higher transparency for near infrared light than the n-type. InP substrate. Embodiment 2 employs a SI-InP wafer as a substrate.

An InGaAs light receiving layer 2 is epitaxially grown on the SI-InP substrate 14. A p-type region 3 is formed at a central part of the InGaAs light receiving layer 2 by thermal diffusion of a p-type dopant (e.g., zinc (Zn)) via a passivation film mask having a central opening per chip. A pn-junction 4 is generated at a boundary between the n-InGaAs light receiving layer 2 and the p-type region 3. The pn-junction 4 makes a wide n-depletion layer below. An allover p-type electrode 5 is formed upon the p-type region 3. Uppermost ends of the pn-junction 4 are covered with the passivation film 6. Since the SI-InP substrate 14 does not lead electric current, an n-type electrode cannot be formed on the bottom of the substrate 14. Then, a periphery of the passivation film 6 is removed for revealing the peripheral n-InGaAs surface. An annular n-type electrode 13 is formed on the revealed peripheral n-InGaAs layer on the top surface. A reverse bias will be applied in the horizontal direction between the central p-type electrode 5 and the peripheral n-type electrode 13 on the top surface. The bottom of the SI-InP substrate 14 is free from electrodes. A resin film (e.g., polyimide) 10 and a dielectric multilayered film 11 are plied upon the bottom of the SI-InP substrate 14. The resin film 10 and the dielectric multilayered film 11 build a wavelength selective filter 12 which repulses unnecessary light (noise light; $\lambda 1$) and allows necessary light (signal light; $\lambda 2$) to pass through. The cut-off wavelength of the wavelength selective filter 12 should be determined to be an intermediate wavelength between the noise light wavelength ($\lambda 1$) and the signal light wavelength ($\lambda 2$).

In the case of the bidirectional simultaneous communications using two wavelengths of $\lambda 1=1.3\,\mu m$ (upstream) and $\lambda 2=1.55\,\mu m$ (downstream), a subscriber has a receiving module which should detect $\lambda 2$ (1.55 $\mu m$) light but should be insensitive to $\lambda 1$ (1.3 $\mu m$) light. Embodiment 2 employs the wavelength selective filter which reflects away the $\lambda 1$ (1.3 $\mu m$) light.

A new aspect of Embodiment 2 is the SI(semi-insulating)-InP substrate instead of the n-type InP substrate. The "semi-insulating" means high resistivity. Doping of an iron-kind metal makes SI-InP crystal which does not lead electric current. The SI-substrate has a drawback that an n-type electrode cannot be formed on the bottom of the SI-substrate.

The iron (Fe) doped SI-InP substrate has a strong point of lower absorption or higher transparency for light than the n-type InP substrate. The SI-InP substrate is preferable for a bottom incidence type photodiode, since light passes the substrate. The sensitivity is enhanced by a decrease of absorption loss in the substrate.

The SI-substrate type PD has no n-type electrode on the bottom. The whole of the bottom of the substrate can be overall covered with the wavelength selective filter as shown in FIG. 4. Embodiment 2 dispenses with the extra etching of eliminating the redundant parts of the wavelength selective filter adhering on the bottom n-type electrode 7 of Embodiment 1. This is another merit of Embodiment 2. Since the bottom of the photodiode chip is electrically insulated from the upper electrodes, no submount is required for insulating the photodiode mounted on a metallic package. Saving of the submount is a further advantage of Embodiment 2 over Embodiment 1. The n-type electrode and the p-type electrode are formed on the top electrically separated from the bottom, which enhances freedom of wiring. Either the n-type electrode and the p-type electrode can be assigned to be either a ground level or a source level.

Figure 5:
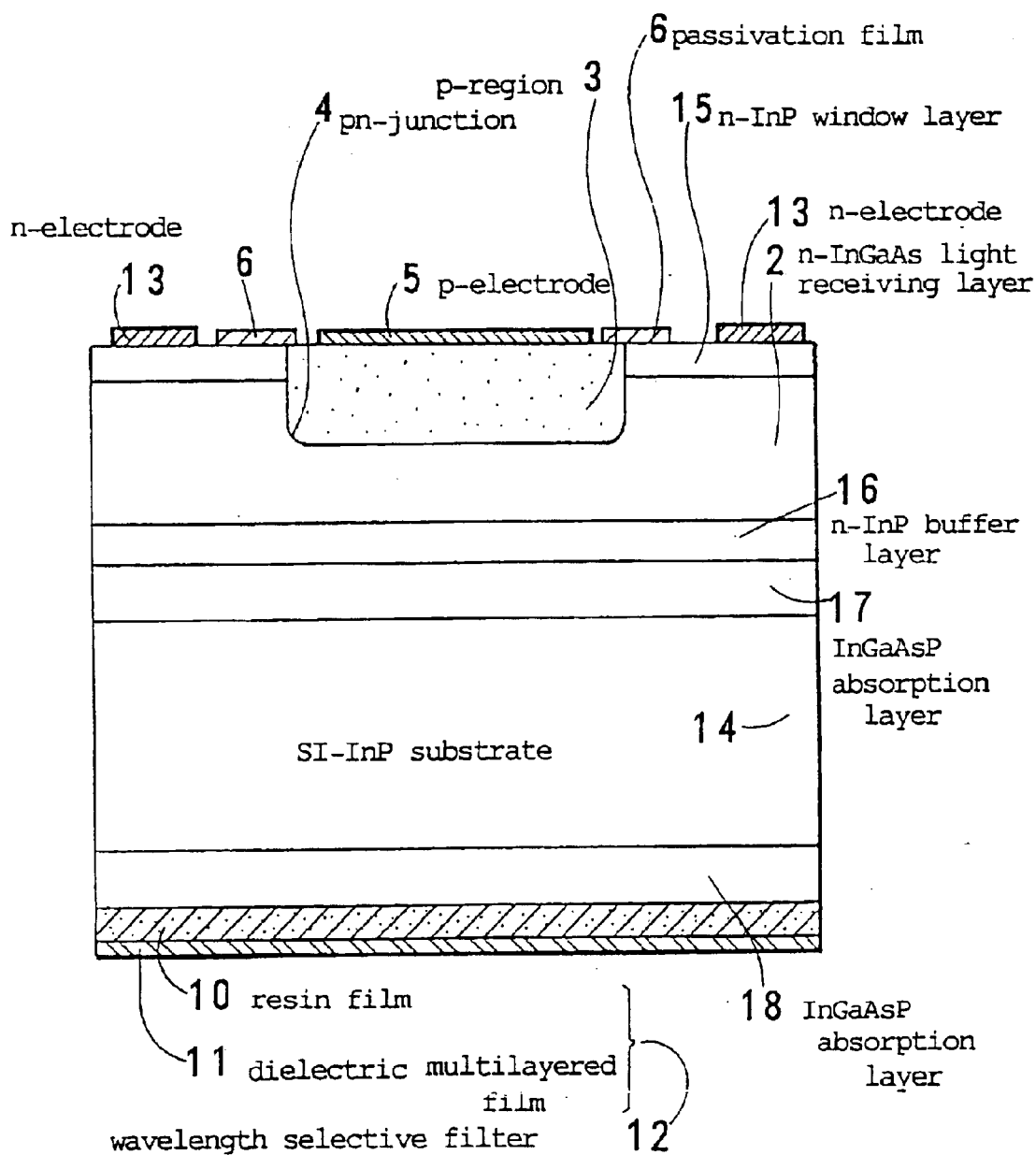
FIG. 5 is a cross-sectional view of Embodiment 3 of the present invention applied to a bottom incidence type photodiode having an SI (semi-insulating)-InP substrate and an InGaAsP absorption layer covering the bottom of the SI-InP substrate.

Embodiment 3 (Bottom Incidence Type, SI-substrate, $\lambda 1$ Absorption Layer; FIG. 5)

Embodiment 2 succeeds in reflecting the normal incidence 1.3 $\mu m$ light by the wavelength selective filter 12 but permits a part of slanting incidence 1.3 $\mu m$ light to enter the photodiode. The dielectric multilayered film is designed to reflect only the normal incidence 1.3 $\mu m$ light of a 0 degree incidence angle with a high rate. Slanting incidence 1.3 $\mu m$ light can penetrate the dielectric multilayered film. It is a defect of the dielectric multilayered film which either reflects or refracts incidence light and does not absorbs light. Reflection has strong dependency upon the incidence angle. Embodiment 3 aims at eliminating the slanting incidence 1.3 $\mu m$ light also as noise. FIG. 5 shows Embodiment 5 having an additional, extra built-in absorption layer which absorbs 1.3 $\mu m$ light of any incidence angles.

A starting substrate is an iron doped semi-insulating (SI)-InP wafer for the sake of high transparency for $\lambda 2$ like Embodiment 2. An InGaAsP absorption layer 17, an n-InP buffer layer 16, an n-InGaAs light receiving layer 2 and an n-InP window layer 15 are in series epitaxially grown on the top surface of the SI-InP substrate 14. Then, an InGaAsP absorption layer 18 is epitaxially grown on the bottom of the SI-InP substrate 14. A p-type region 3 is produced by selective diffusion of zinc (Zn) via a passivation film mask. A boundary between the n-InGaAs light receiving layer 2, the n-InP window layer and the p-type region 3 is a pn-junction 4. Since the p-type region is made by the passivation film mask, ends of the pn-junction are covered with the passivation film 6 in a self-alignment. A peripheral part of the passivation film 6 is eliminated. An allover p-type electrode 5 is formed upon the central p-type region 3. An annular n-type electrode 13 is ohmically formed upon the peripheral part of the n-InP window layer 15. Both the p-type electrode 5 and the n-type electrode 13 are on the top of the chip.

A resin film (e.g., polyimide) 10 and a dielectric multilayered film 11 are in series formed overall upon the bottom of the InGaAsP absorption layer 18. A set of the resin film 10 and the dielectric multilayered film 11 builds a wavelength selective filter which reflects unnecessary noise light of a right angle incidence and allows necessary signal light to pass. Embodiment 3 is characterized by an addition of the upper InGaAsP absorption layer 17 on the top of the substrate 14 and the lower InGaAsP absorption layer 18 on the bottom of the substrate 14 for absorbing unnecessary noise $\lambda 1$ light. The InGaAsP absorption layers 17 and 18 absorb slanting noise light of any incidence angles. Unlike reflection or refraction, absorption is independent of the geometry of the beam incidence.

Embodiment 3 employs the InGaAsP absorption layers 17 and 18 having a band gap edge wavelength ($\lambda g=hc/Eg$) of 1.42 $\mu m$. The thickness of the InGaAsP absorption layers is several micrometers, preferably about 5 micrometers ($\mu m$). Who has first proposed the employment of the InGaAsP absorption layer in a photodiode for annihilating noise light is the same inventors as the present invention.

Since Embodiment 3 has the InGaAsP absorption layers 17 and 18, slanting incidence noise light is fully absorbed by the layers. The upper absorption layer 17, in particular, has an extra effect for repulsing the slanting noise light going into the photodiode via the side of the substrate. Even one absorption layer, however, is also effective for annihilating noise light. Either of the upper layer 17 and the lower layer 18 can be omitted. The photodiode chip of FIG. 5 can be bonded on a base in a package by a resin adhesive. The PD chip can be soldered on a base by preliminarily making a metallized ring on the bottom of the wavelength selective filter 12.

Figure 6:
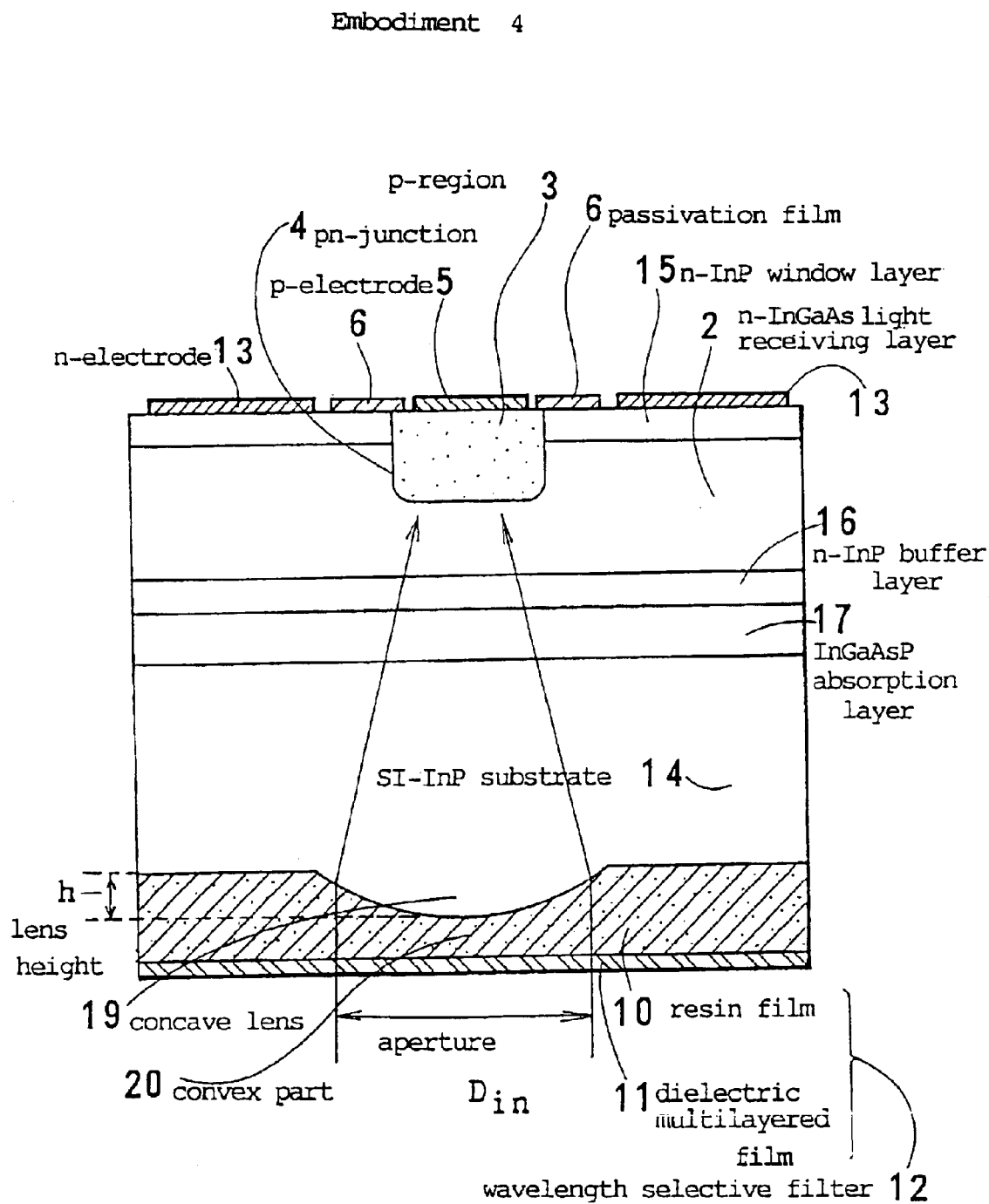
FIG. 6 is a cross-sectional view of Embodiment 4 of the present invention applied to a bottom incidence type photodiode having an SI (semi-insulating)- InP substrate with a built-in lens and an InGaAsP absorption layer covering the top of the SI-InP substrate.
Figure 7:
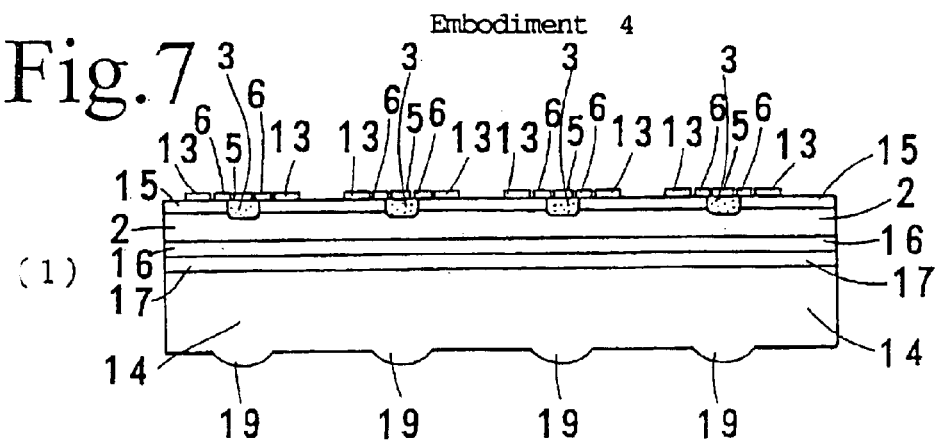
FIG. 7 is a series of cross-sectional views of a part of a PD-processed wafer for demonstrating steps of producing a photodiode of Embodiment 4.
Figure 7:
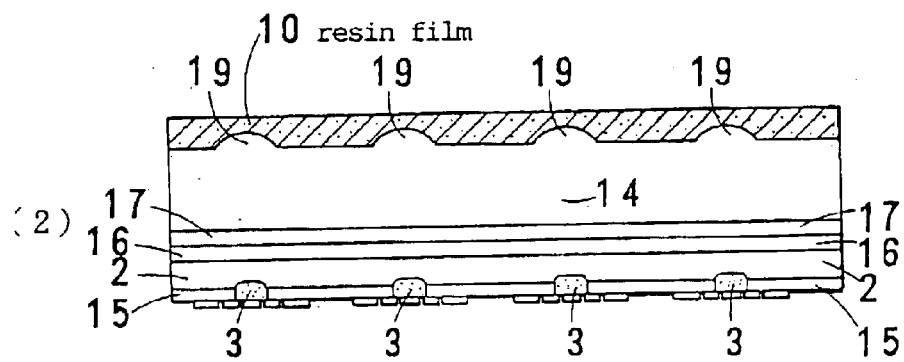
Figure 7:
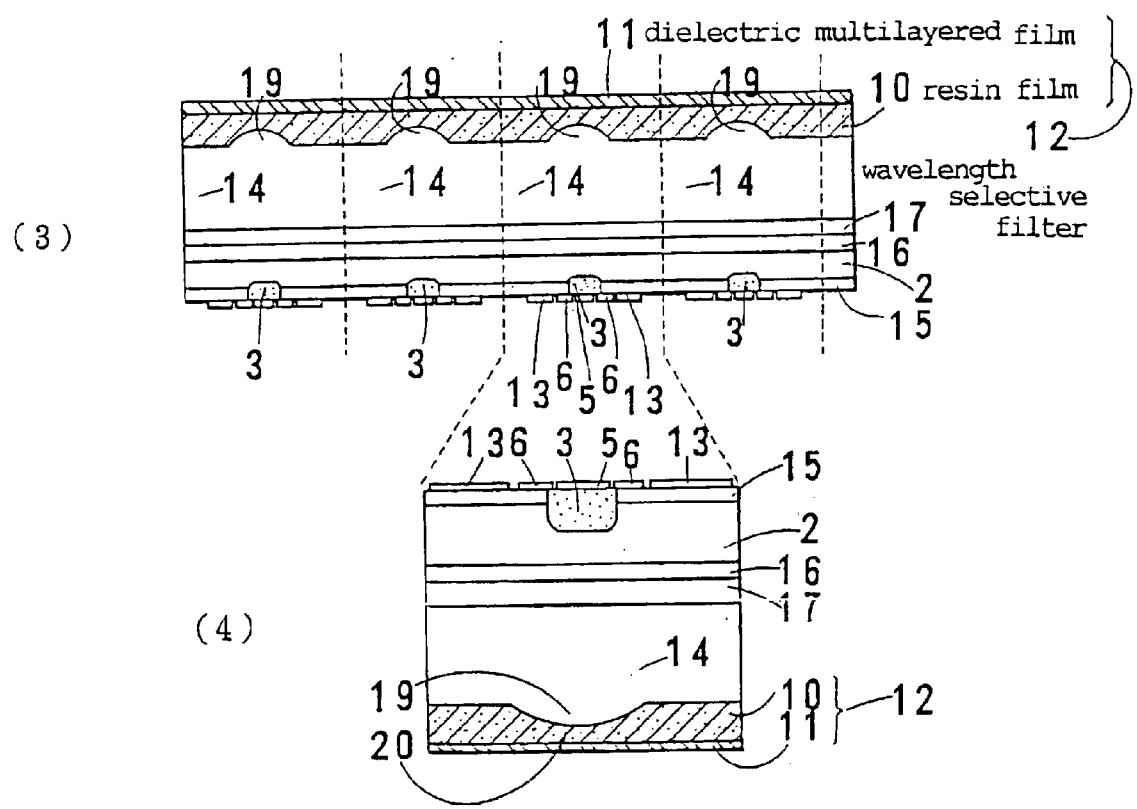

Embodiment 4 (Bottom Incidence, SI-substrate, $\lambda 1$ Absorption Layer, Built-in Lens; FIG. 6, FIG. 7)

FIG. 6 shows Embodiment 4 having a built-in lens for converging light beams to a depletion layer below a central pn-junction.

A starting substrate is a semi-insulating (SI)-InP wafer. An InGaAsP absorption layer 17, an n-InP buffer layer 16, an n-InGaAs light receiving layer 2 and an n-InP window layer 15 are in series epitaxially grown on the top surface of the SI-InP substrate 14. A narrow p-type region 3 is produced by selective diffusion of zinc (Zn) via a passivation film mask. A narrow boundary between the n-InGaAs light receiving layer 2, the n-InP window layer and the p-type region 3 is a pn-junction 4. The pn-junction of Embodiment 4 is narrower than the preceding embodiments. Upper ends of the pn-junction 4 is covered with a passivation film 6 in a self-alignment. A peripheral part of the passivation film 6 is circularly eliminated. A small round p-type electrode 5 is formed ohmically upon the central p-type region 3. An annular n-type electrode 13 is ohmically formed upon the peripheral part of the n-InP window layer 15. A built-in spherical lens part 19 is produced at the center of the bottom by masked anisotropic etching of the substrate. The built-in lens has a height "h" and a diameter "$D_{in}$".

The wavy bottom of the SI-InP substrate 14 is incrusted with a flat resin (e.g., polyimide) film 10 by spin-coating. The spin-coating ensures a flatness of the surface of the resin film 10. The convex lens part 19 makes a complementary concave 20 of resin film 20. A dielectric multilayered film 11 is formed overall upon the flat resin film 10. The flatness is important for the dielectric film, since the designed wavelength selectivity is obtained for the dielectric film made on the flat surface. The resin film 10 and the dielectric multilayered film 11 build a wavelength selective filter 12. The convex substrate and concave resin film make the convex lens 19 which converges light beams to a restricted depletion layer beneath the narrow pn-junction. The radius of the convex part 19 is denoted by R. The refractive index of the resin is denoted by $n_1$. The refractive index of the substrate is denoted by $n_2$. The focal length f of the lens is $f=n_2R/(n_2-n_1)$.

It is nearly impossible to form the dielectric multilayered film on a rugged surface. Embodiment 4 succeeds in encrusting the lens-formed, rugged surface with the wavelength selective filter which requires rigorous flatness of an underlayer by coating the rugged surface once to a flat plane with the resin film. Embodiment 4 demonstrates an advantage of the present invention most conspicuously. The converging lens 19 and the wavelength selective filter 12 characterize Embodiment 4. One absorption layer 17 is added between the n-InP buffer layer 16 and the SI-InP substrate 14 for absorbing noise λ1 light in Embodiment 4. The number of absorption layers should be determined by taking account of the intensity of noise λ1 light. The absorption layer can be omitted in Embodiment 4.

The built-in lens enables Embodiment 4 to converge entering light at the narrow pn-junction 4 and to enhance the sensitivity. Convergence by the lens allows the narrow pn-junction and the narrow p-type region. The narrowness reduces the electrostatic capacitance of the pn-junction. Reduced capacitance improves high speed response of the photodiode. High sensitivity and high speed performance give an optimum photodiode for high speed optical communications.

FIGS. 7(1), (2), (3) and (4) show the steps of producing the photodiode of Embodiment 4. FIG. 7(1) denotes the step of making a leased substrate. A starting material is an iron-doped SI-InP wafer of a 350 μm thickness. A 2 μm thick n-InP buffer layer (not shown in figures) is formed on a top surface of the SI-InP substrate 14. A 5 μm thick InGaAsP absorption layer 17 having band edge wavelength λg=1.42 μm is grown upon the buffer layer by a chloride vapor phase epitaxy method (chloride VPE). Another 2 μm thick n-InP buffer layer 16 is formed on the InGaAsP absorption layer 17. An InGaAs light receiving layer 2 of a thickness of 4 μm is grown upon the n-InP buffer layer 16. An InP capping (or window) layer 15 of a 1.5 μm thickness is grown upon the InGaAs light receiving layer 2. The InP capping layer 15 has a band gap wider than the InGaAs light receiving layer 2. The capping layer 15 has a function of reducing dark current.

A silicon nitride (SiN) mask is made on the InP capping layer 15 by depositing an SiN film on the capping layer 15 and perforating a small hole of a 60 μm diameter at a middle of every chip part by lithography. Zinc (Zn) is thermally diffused via the holes of the mask into the epitaxial InP wafer. The Zn-diffusion makes a p-type region 3 and a pn-junction 4 on every chip part. The ends of the pn-junction 4 are covered with the passivation films 6. Peripheral parts of the passivation films 6 are etched away for revealing the n-InP capping layer 15.

An Au/Zn p-type electrode 5 is formed on the central p-type region 3 and an annular Au/Ge/Ni n-type electrode 13 is formed on the periphery for every chip part.

The bottom of the substrate is polished to a wafer thickness of 200 μm. The optimum thickness of the wafer should be determined by a converging lens 19. The 200 μm thickness is an optimum value for a 60 μm diameter of a light receiving area (pn-junction). The wafer is turned upside down. The converging lenses 19 are produced by covering the bottom of the SI-InP substrate with a photoresist, eliminating the photoresist except the parts allocated to lenses, reforming the remaining resist films as round hills, grinding the resist-masked bottom of the SI-InP substrate by ion-milling, and shaping the lenses on the bottom. The hill-shaped resist film enables the ion-milling to shape circular protrusions suitable for lenses. Thus, the built-in lenses are produced on the bottom of the SI-InP substrate.

The height of the lens 19 is, for example, h=17 μm. The curvature radius is, for example, R=115 μm. The diameter of the aperture is, e.g., $D_{in}$=120 μm. The center O of a sphere of the lens lies at a height of 98 μm above the flat bottom. The values of the parameters h, R, $D_{in}$, O should be determined by considering the thickness of the chip, the diameter of the pn-junction and the refractive index of the resin. The focal length f which is given by $f=n_2R/(n_2-n_1)$ should coincide with the distance from the lens to the pn-junction (light sensing region).

The built-in lens 19 enables the photodiode to converge incidence light at the pn-junction (light sensing region) distanced by 190 μm from the lens. Convergence of light enhances the sensitivity. The convergence allows Embodiment 4 to narrow the light sensing region (pn-junction) down to, e.g., a 70 μm diameter, a 50 μm diameter or a 30 μm diameter. An extremely narrow pn-junction achieves superb high speed response by reducing the capacitance of the pn-junction.

FIG. 7(2) shows a resin-coating step. A transparent resin film 10 is made by spin-coating the leased bottom of the substrate with a transparent resin fluid, e.g., a polyimide acid solution, to a thickness higher than the height of the lens and hardening the resin at 350° C. (in the case of polyimide). A suitable thickness of the resin is, for example, 40 μm for a lens height of 20 μm.

The transparent resin film 10 can be made of fluoric polyimide having an equivalent property instead of polyimide. Otherwise, benzocyclobutene (BCB) and deuteride silicone resins which have equivalent heat-resistance and optical properties to the polyimide are available for the resin film 10.

A suitable resin should be transparent for signal light, at first fluid paintable on a wafer and rigid sufficient for piling dielectric layers thereupon but elastic for alleviating inner stress after hardening (setting). The resin should have heat resistance against about 300° C., since the resin film experiences succeeding processes of wire-bonding and electrode-fabrication requiring heating up to about 300° C. The resin film has functions of burying lensed, rugged surface, eliminating a bad effect of the wavy surface, preparing a flat surface for forming flat multilayers.

FIG. 7(3) shows a step of forming dielectric multilayers on the resin film. The (e.g., polyimide) resin film is coated with a set of dielectric materials chosen from $MgF_2$, $SiO_2$, $Al_2O_3$, $Ta_2O_5$, $Nb_2O_5$, $TiO_2$, $Zr_2O_3$, SiON etc.

For example, a filter which reflects wavelengths shorter than 1.42 μm but allows wavelengths longer than 1.42 μm is obtained by repeating 36 times of piling of a unit set of a $SiO_2$ layer of a lower refractive index and a $TiO_2$ layer of a higher refractive index. The $SiO_2/TiO_2$ filter (72 layers) is made by evaporation or sputtering. Embodiment 4 employs electron-beam evaporation.

Embodiment 4 covers allover the bottom with the multilayered film 11 as shown in FIG. 6. Otherwise, a narrower multilayered film restricted within a central part of the bottom slightly wider than the built-in lens 19 can be also employed for Embodiment 4.

Finally, the processed wafer is divided into individual photodiode chips by cutting along dotted lines parallel to cleavage lines as shown in FIG. 7(3) by mechanical dicing or natural cleavage. FIG. 7(4) shows the upside-down photodiode chip after cutting the wafer of FIG. 7(3) by natural cleavage.

Wavelength selectivity of the photodiode chip is estimated by measuring a 1.3 μm wavelength sensitivity $R_{1.3}$ and a 1.55 μm sensitivity $R_{1.55}$. It is confirmed that $R_{1.3}$ is about 1/1000 of $R_{1.55}$. A fraction 1/10 of 1/1000 is an effect of the InGaAsP absorption layer. Another fraction 1/100 of 1/1000 is a net effect of the wavelength selective filter. The result clarifies that Embodiment 4 is a photodiode having high wavelength selectivity and a good convergence lens.

Preceding embodiments have the wavelength selectivity between noise 1.3 μm (λ1) and signal 1.55 μm (λ2) which is suitable for a photodiode module in an ONU (optical network unit) in the bidirectional simultaneous communications between a station and subscribers (ONUs). This invention is applicable to separating a family of neighboring wavelengths with a narrow spacing, for example, 1.50 μm, 1.52 μm, 1.54 μm and 1.56 μm with a 20 nm spacing. The present invention can be applied to a high density multi-wavelength transmission system, e.g., the DWDM or the CWDM. These applications can dispense with the epitaxially grown absorption layers.

Figure 8:
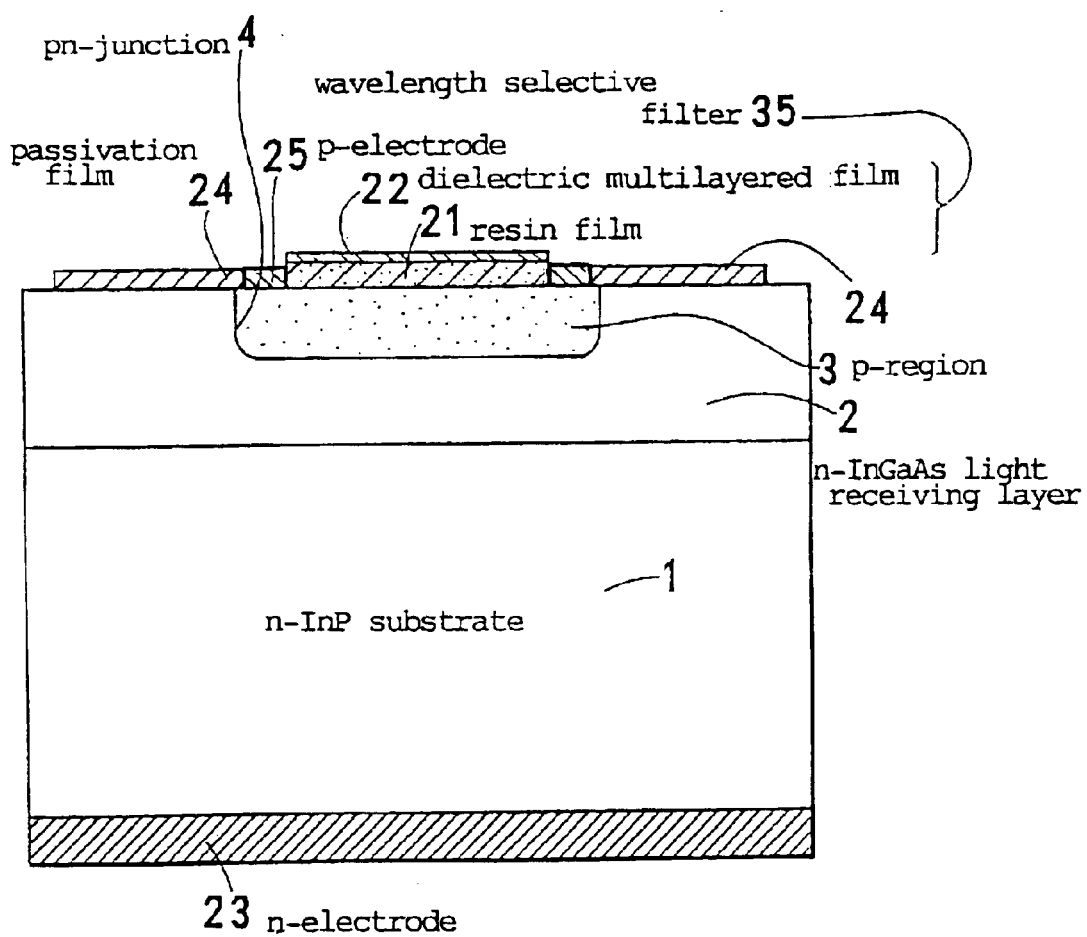
FIG. 8 is a cross-sectional view of Embodiment 5 of the present invention applied to a top incidence type photodiode having an n-InP substrate.

Embodiment 5 (Top Incidence, Top Wavelength Selective Filter; FIG. 8)

Preceding embodiments are all bottom incidence type photodiodes. This invention can be also applicable to a top incidence type photodiode. FIG. 8 demonstrates Embodiment 5 of the top incidence type. Since signal light does not pass a substrate, transparency is insignificant. A starting material is an n-type InP substrate 1. An InGaAs light receiving layer 2 is epitaxially grown upon the n-InP substrate 1. A p-type region 3 is made at a center by diffusing Zn through a passivation film mask. An interface between the n-InGaAs light receiving layer 2 and the p-type region 3 is a pn-junction 4. Ends of the pn-junction 4 are protected by a passivation film 24. An overall n-type electrode 23 is formed on the bottom of the n-InP substrate 1. A small, annular p-type electrode 25 with an opening is formed upon the periphery of the p-type region 3. A resin film 21 and a-dielectric multilayered film 22 are piled upon the central opening within the p-type region 3. A set of the resin film 21 and the dielectric multilayered film 22 is called a wavelength selective filter 35. The p-type electrode 25 is in contact with the wavelength selective filter 35 on sides. Signal light enters the photodiode via the top wavelength selective filter 35 on the top opening. Embodiment 5 has a light receiving region (pn-junction) of a diameter of 100 μm to 150 μm.

Figure 9:
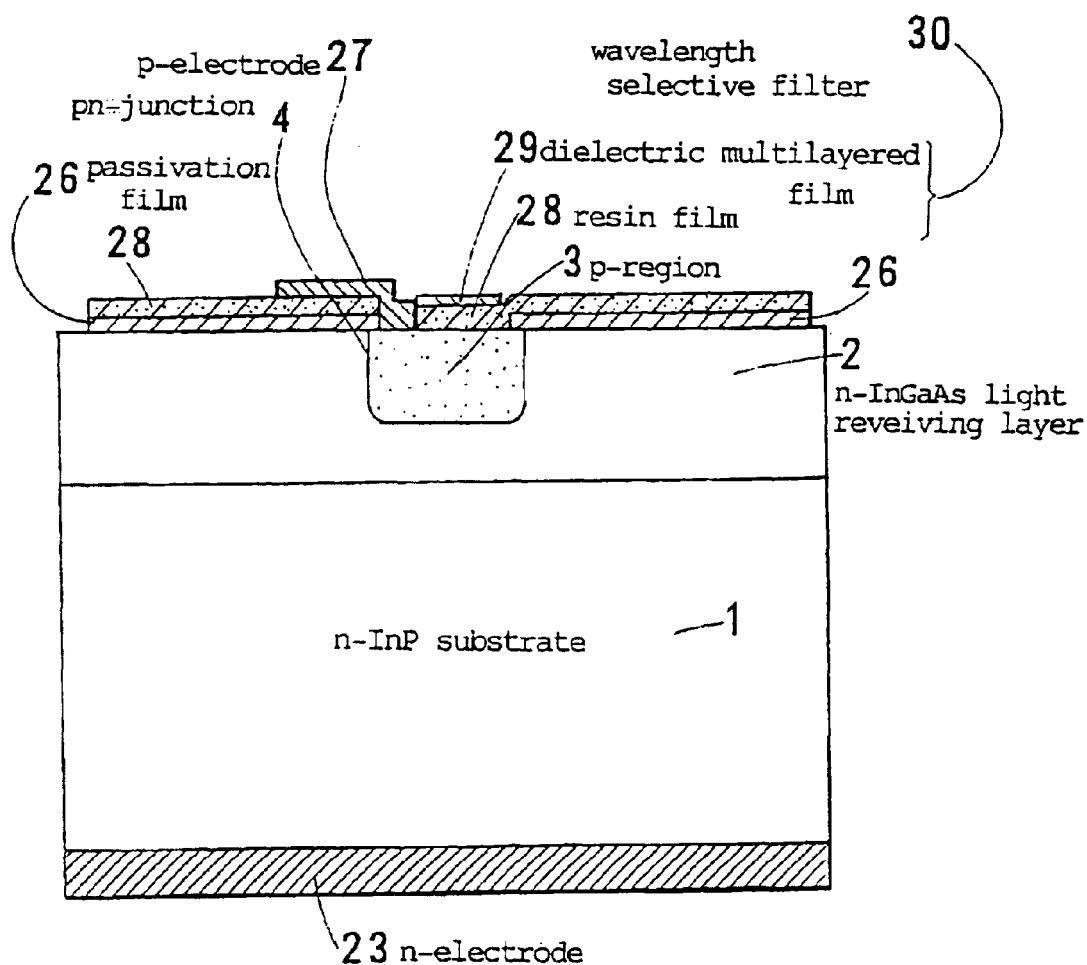
FIG. 9 is a cross-sectional view of Embodiment 6 of the present invention applied to a top incidence type photodiode having an n-InP substrate and a narrow top aperture for light incidence.

Embodiment 6 (Top Incidence, Top Wavelength Selective Filter, High Speed; FIG. 9)

Embodiment 6 is an application to a high speed photodiode of a top incidence type. FIG. 9 shows Embodiment 6 endowed with high speed performance. An InGaAs light receiving layer 2 is epitaxially grown upon an n-InP substrate 1. A narrow p-type region 3 is made at a center by diffusing Zn through a passivation film mask. The diameter of the p-type region 3 is 30 μm to 50 μm which is far smaller than Embodiment 5. An interface between the n-InGaAs light receiving layer 2 and the p-type region 3 is a pn-junction 4. Ends of the pn-junction 4 are protected by a passivation film 26 which covers an allover periphery of the top surface of the chip.

An overall n-type electrode 23 is formed on the bottom of the n-InP substrate 1. A resin film 28 is overall piled upon the central opening and upon the passivation film 26. A dielectric multilayered film 29 is selectively deposited upon the resin film 28 just above the p-type region 3. A set of the resin film 28 and the dielectric multilayered film 29 build a wavelength selective filter 30. A small hole is perforated in the dielectric film 29 and the resin film 28 upon a peripheral point of the p-type region 3. A dotted p-type electrode 27 with an extension tail is formed upon the revealed point of the p-type region 3. The extension tail lies upon the resin film 28 for giving a pad of wire-bonding. Signal light λ2 enters the photodiode via the top wavelength selective filter 30 through the top opening. Noise light λ1 is reflected by the top wavelength selective filter 30.

High speed response requires narrowness of a sensing area (pn-junction) and low capacitance of a junction. A photodiode for over 1 Gbps bit rates should have a sensing area of a diameter smaller than 50 μm. Embodiment 6 has a narrow light receiving region (pn-junction) of a diameter of 30 μm to 50 μm.

Such an extremely narrow p-type electrode 27 cannot be a pad enough for wire-bonding. Thus, the p-type electrode 27 has a tail partially extending upon the resin film 28 as a wire-bonding pad for a golden wire. Embodiment 6 sufficiently operates up to a 2.5-Gbps bit rate. Embodiment 6 clarifies that this invention gives high speed, wavelength selective, top incidence photodiodes.

Embodiment 7 (Top Incidence, Top Wavelength Selective Filter; FIG. 10)

Embodiment 7 is another application to a high speed photodiode of a top incidence type. FIG. 9 shows Embodiment 7. An InGaAs light receiving layer 2 and an InGaAsP window/absorption layer 31 are epitaxially grown upon an n-InP substrate 1. An addition of the InGaAsP window/absorption layer 31 features Embodiment 7. Other members are similar to Embodiment 6. A narrow p-type region 3 is formed at a center of a chip by diffusing Zn through a passivation film mask having central openings. The diameter of the p-type region 3 is 30 μm to 50 μm similar to Embodiment 6. An interface between the InGaAsP absorption/window layer 31 and the p-type region 3 and an interface between the n-InGaAs light receiving layer 2 and the p-type region 3 are a pn-junction 4. Upper ends of the pn-junction 4 are protected by the passivation film 26 which covers an allover periphery of the top surface of the chip. An overall n-type electrode 23 is formed on the bottom of the n-InP substrate 1. A resin film 28 is overall piled upon the central opening and upon the passivation film 26. A dielectric multilayered film 29 is selectively deposited upon the resin film 28 just above the p-type region 3. A set of the resin film 28 and the dielectric multilayered film 29 build a wavelength selective filter 30. A small hole is perforated in the dielectric film 29 and the resin film 28 upon a peripheral point of the p-type region 3. A dotted p-type electrode 27 with an extension tail is formed upon the revealed point of the p-type region 3. The extension tail lies upon the resin film 28 for giving a pad of wirebonding. The wavelength selective filter 30 allows signal light $\lambda 2$ to enter the photodiode through the top opening but reflects noise light $\lambda 1$ by the dielectric multilayered film 29.

Embodiment 7 sufficiently operates up to a 2.5 Gbps bit rate owing to the narrow light receiving region (pn-junction) of a 30 μm to 50 μm diameter.

Embodiment 7 has the additional window/absorption InGaAsP layer 31. Noise $\lambda 1$ light is reflected by the upper wavelength selective filter 30 and absorbed by the lower window/absorption InGaAsP layer 31. Noise $\lambda 1$ light is doubly excluded from the photodiode of Embodiment 7.

Other Examples

Other examples can be also available for the above-mentioned Embodiments.

One example is employed for an optical element using an Er (erbium)-doped optical fiber for amplifying 1.55 μm light by 0.98 μm light which is injected to the fiber in the same direction as signal light of 1.55 μm. In this case, on the side of subscribers, a wavelength to be removed is 0.98 μm and a wavelength $\lambda 2$ to be received is 1.5.5 μm. This improved PD of this invention having the wavelength selective filter and the absorption layer succeeds in removing the noise light of 0.98 μm and receiving exclusively the signal light of 1.55 μm.

Another example having the same structure as the preceding example is used for amplifying 1.55 μm light by 1.48 μm light which is injected to the fiber in the same direction as signal light of 1.55 μm. A wavelength of 1.48 μm is noise for the PD and should be excluded. In this case, since the difference of wavelength between the noise light of 1.48 μm and the signal light of 1.55 μm is minute, the absorption layer is not very useful for excluding the light. So, the wavelength selective filter of this invention is awfully effective for reflecting the 1.48 μm noise light which is not sufficiently absorbed by the absorption layer. This invention also applies the PD to reflecting the noise wavelength close to the signal light.

What is claimed is:

1. A photodiode comprising:
   a semiconductor substrate having a top surface and a bottom surface;
   a first conductive type light receiving layer being grown on the top surface of the substrate and having a first conductive type region;
   a second conductive type region made in the first conductive type light receiving layer;
   a pn-junction formed in the light receiving layer as an interface between the first conductive type region and the second conductive type region; and
   a wavelength selective filter including a stress-alleviating transparent resin film deposited on an aperture surface through which signal light of a wavelength $\lambda 2$ goes in and a dielectric multilayered film deposited on the resin film for reflecting noise light of a wavelength $\lambda 1$, the aperture surface being the bottom surface of the substrate or a top surface of the second conductive type region.

2. The photodiode according to claim 1, wherein the semiconductor substrate is transparent to signal light of the wavelength $\lambda 2$, a first electrode formed on a top of the first conductive type region or the bottom surface of the substrate, and a second electrode formed on the second conducive type region enclosed by the pn-junction.

3. The photodiode according to claim 2, wherein ends of the pn-junction are protected with a passivation film.

4. The photodiode according to claim 3, wherein the photodiode is a bottom incidence type which receives signal light coming via the bottom of the substrate.

5. The photodiode according to claim 4, wherein a capping layer having a band gap wider than the light receiving layer is grown on the light receiving layer.

6. The photodiode according to claim 5, wherein the wavelength $\lambda 2$ of signal light is longer than the wavelength $\lambda 1$ of noise light, and an absorption layer having a band gap edge wavelength $\lambda g$ which is longer than $\lambda 1$ but shorter than $\lambda 2$ is added on the bottom of the substrate.

7. The photodiode according to claim 5, wherein the wavelength $\lambda 2$ of signal light is longer than the wavelength $\lambda 1$ of noise light, and an absorption layer having a band gap edge wavelength $\lambda g$ which is longer than $\lambda 1$ but shorter than $\lambda 2$ is added between the substrate and the light receiving layer.

8. The photodiode according to claim 5, wherein the wavelength $\lambda 2$ of signal light is longer than the wavelength $\lambda 1$ of noise light, an absorption layer having a band gap edge wavelength $\lambda g$ which is longer than $\lambda 1$ but shorter than $\lambda 2$ is added between the substrate and the light receiving layer, and another absorption layer having a band gap edge wavelength $\lambda g$ which is longer than $\lambda 1$ but shorter than $\lambda 2$ is added on the bottom of the substrate.

9. The photodiode according to claim 8, wherein the first conductive type is an n-type, the second conductive type is a p-type, the substrate is an n-type substrate or a semi-insulating InP substrate, the light receiving layer is an n-type, the first electrode is a hole-having n-type electrode formed on the bottom of the substrate, and the second electrode is a p-type electrode formed on the top p-type region.

10. The photodiode according to claim 9, wherein the substrate is an n-InP substrate or a semi-insulating InP substrate, and the light receiving layer is an n-InGaAs layer.

11. The photodiode according to claim 10, wherein a built-in lens is formed on the bottom of the substrate by making a spherical protrusion on the bottom of the substrate and coating the protrusion with a flat resin film having a refractive index lower than the substrate.

12. The photodiode according to claim 11, wherein the dielectric multilayered film is a pile of dielectric thin films having different refractive indices and different thicknesses for reflecting noise $\lambda 1$ light.

13. The photodiode according to claim 12, wherein the transparent resin is polyimide.

14. The photodiode according to claim 12, wherein the transparent resin is fluoric polyimide.

15. The photodiode according to claim 12, wherein the transparent resin is benzocyclobutene.

16. The photodiode according to claim 12, wherein the transparent resin is a deuteride silicone resin.

17. The photodiode according to claim 12, wherein the transparent resin is siloxane polymer.

18. The photodiode according to claim 12, wherein the signal light wavelength $\lambda 2$ ranges from 1.5 μm to 1.6 μm, and the noise light wavelength $\lambda 1$ ranges from 1.2 μm to 1.3 μm.

19. The photodiode according to claim 12, wherein the signal light wavelength $\lambda 2$ belongs to a 1.5 $\mu$m to 1.6 $\mu$m band or a 1.3 $\mu$m band, and the wavelength selective filter allows only a single wavelength to pass through but reflects all other wavelength.

20. The photodiode according to claim 12, wherein the signal light wavelength $\lambda 2$ belongs to a 1.5 $\mu$m to 1.6 $\mu$m band, and the noise light wavelength is 0.98 $\mu$m.

21. The photodiode according to claim 12, wherein the signal light wavelength $\lambda 2$ belongs to a 1.5 $\mu$m to 1.6 $\mu$m band, and the noise light wavelength is 1.48 $\mu$m.

22. The photodiode according to claim 18, wherein the wavelength $\lambda 2$ of signal light is longer than the wavelength $\lambda 1$ of noise light, and an InGaAsP absorption layer having a band gap edge wavelength $\lambda g$ which is longer than $\lambda 1$ but shorter than $\lambda 2$ is added on the bottom of the substrate.

23. The photodiode according to claim 18, wherein the wavelength $\lambda 2$ of signal light is longer than the wavelength $\lambda 1$ of noise light, an InGaAsP absorption layer having a band gap edge wavelength $\lambda g$ which is longer than $\lambda 1$ but shorter than $\lambda 2$ is added between the substrate and the light receiving layer.

24. The photodiode according to claim 18, wherein the wavelength $\lambda 2$ of signal light is longer than the wavelength $\lambda 1$ of noise light, an InGaAsP absorption layer having a band gap edge wavelength $\lambda g$ which is longer than $\lambda 1$ but shorter than $\lambda 2$ is added between the substrate and the light receiving layer, and another InGaAsP absorption layer having a band gap edge wavelength $\lambda g$ which is longer than $\lambda 1$ but shorter than $\lambda 2$ is added on the bottom of the substrate.

25. The photodiode according to claim 18, wherein an n-InP capping layer is added to the InGaAs light receiving layer.

26. The photodiode according to claim 18, wherein the substrate is an iron(Fe)-doped SI-InP substrate, the pn-junction has a diameter of 120 $\mu$m to 30 $\mu$m, and a hole having n-type electrode is formed on a periphery of the top surface of the light receiving layer.

27. The photodiode according to claim 26, wherein the pn-junction has a diameter of 70 $\mu$m to 30 $\mu$m, and the SI-InP substrate has a built-in lens on the bottom which converges light at the pn-junction.

28. The photodiode according to claim 18, wherein the substrate is a sulfur (S)-doped or tin (Sn)-doped n-InP substrate, the pn-junction has a diameter of 120 $\mu$m to 30 $\mu$m, a p-type electrode is formed overall on the top of the p-type region, and a hole having n-type electrode is formed on the bottom surface of the n-InP substrate.

29. The photodiode according to claim 28, wherein the pn-junction has a diameter of 70 $\mu$m to 30 $\mu$m, and the n-InP substrate has a built-in lens on the bottom which converges light at the pn-junction.

30. The photodiode according to claim 8, wherein the first conductive type is a p-type, the second conductive type is an n-type, the substrate is a p-type substrate, the light receiving layer is a p-type, the first electrode is an annular p-type electrode formed on the bottom of the substrate, and the second electrode is an n-type electrode formed on the top n-type region.

31. The photodiode according to claim 3, wherein the photodiode is a top incidence type which receives signal light coming above the top of the second conductive type region, the first electrode is formed on the bottom surface of the substrate, the second electrode is formed on a part of the second conductive type region, and an extra part of the light receiving layer is covered with the wavelength selective filter including the resin film and the dielectric multilayered film.

32. The photodiode according to claim 31, wherein a window layer having a band gap wider than the light receiving layer is grown on the light receiving layer, and the signal light passes the window layer for arriving at the pn-junction.

33. The photodiode according to claim 31, wherein the first conductive type is an n-type, the second conductive type is a p-type, the substrate is an n-type substrate, the light receiving layer is an n-type, the first electrode is an allover n-type electrode formed on the bottom of the substrate, and the second electrode is an annular or dotted p-type electrode formed on a part of the top p-type region.

34. The photodiode according to claim 33, wherein the substrate is an n-InP substrate or a semi-insulating InP substrate, and the light receiving layer is an n-InGaAs layer.

35. The photodiode according to claim 34, wherein the dielectric multilayered film is a pile of dielectric thin films having different refractive indices and different thicknesses for reflecting noise $\lambda 1$ light.

36. The photodiode according to claim 35, wherein the transparent resin is polyimide.

37. The photodiode according to claim 35, wherein the transparent resin is fluoric polyimide.

38. The photodiode according to claim 35, wherein the transparent resin is benzocyclobutene.

39. The photodiode according to claim 35, wherein the transparent resin is a deuteride silicone resin.

40. The photodiode according to claim 35, wherein the transparent resin is siloxane polymer.

41. The photodiode according to claim 35, wherein the signal light wavelength $\lambda 2$ ranges from 1.5 $\mu$m to 1.6 $\mu$m, and the noise light wavelength $\lambda 1$ ranges from 1.2 $\mu$m to 1.3 $\mu$m.

42. The photodiode according to claim 35, wherein the signal light wavelength $\lambda 2$ belongs to a 1.5 $\mu$m to 1.6 $\mu$m band or a 1.3 $\mu$m band, and the wavelength selective filter allows only a single wavelength to pass through but reflects all other wavelength.

43. The photodiode according to claim 35, wherein the signal light wavelength $\lambda 2$ belongs to a 1.5 $\mu$m to 1.6 $\mu$m band, and the noise light wavelength is 0.98 $\mu$m.

44. The photodiode according to claim 35, wherein the signal light wavelength $\lambda 2$ belongs to a 1.5 $\mu$m to 1.6 $\mu$m band, and the noise light wavelength is 1.48 $\mu$m.

45. The photodiode according to claim 41, wherein the substrate is an iron (Fe)-doped SI-InP substrate, the pn-junction has a diameter of 120 $\mu$m to 30 $\mu$m, an annular or a dotted p-type electrode is formed on a part of the p-type region, a hole having n-type electrode is formed on a periphery of the n-type light receiving layer, and the wavelength selective filter having the resin film and the dielectric multilayered film is formed on an extra part of the p-type region.

46. The photodiode according to claim 45, wherein the pn-junction has a diameter of 70 $\mu$m to 30 $\mu$m, and the p-type electrode has a tail on the resin film for wire-bonding.

47. The photodiode according to claim 41, wherein the substrate is a sulfur (S)-doped or tin (Sn)-doped n-InP substrate, the pn-junction has a diameter of 120 $\mu$m to 30 $\mu$m, an annular or a dotted p-type electrode is formed on a part of the p-type region, the wavelength selective filter having the resin film and the dielectric multilayered film is formed on an extra part of the p-type region, and an n-type electrode is formed overall on the bottom surface of the n-InP substrate.

48. The photodiode according to claim 47, wherein the pn-junction has a diameter of 70 $\mu$m to 30 $\mu$m, and the p-type electrode has a tail on the resin film for wire-bonding.

* * * * *